United States Patent
Lee

(10) Patent No.: US 8,851,012 B2
(45) Date of Patent: *Oct. 7, 2014

(54) VAPOR DEPOSITION REACTOR USING PLASMA AND METHOD FOR FORMING THIN FILM USING THE SAME

(75) Inventor: Sang In Lee, Sunnyvale, CA (US)

(73) Assignee: Veeco ALD Inc., Fremont, CA (US)

( * ) Notice: Subject to any disclaimer, the term of this patent is extended or adjusted under 35 U.S.C. 154(b) by 636 days.

This patent is subject to a terminal disclaimer.

(21) Appl. No.: 12/560,690

(22) Filed: Sep. 16, 2009

(65) Prior Publication Data

US 2010/0068413 A1    Mar. 18, 2010

(30) Foreign Application Priority Data

Sep. 17, 2008 (KR) .......................... 10-2008-0090968
Sep. 14, 2009 (KR) .......................... 10-2009-0086313

(51) Int. Cl.
*C23C 16/00* (2006.01)
*C23C 16/455* (2006.01)
*C23C 16/54* (2006.01)

(52) U.S. Cl.
CPC ........... *C23C 16/54* (2013.01); *C23C 16/45595* (2013.01); *C23C 16/45514* (2013.01)
USPC .................................................. 118/723 E

(58) Field of Classification Search
CPC ................... C23C 16/45595; H01J 37/32532; H01J 37/32541; H01J 37/32568
USPC ....... 118/723 E; 156/345.43, 345.44, 345.45, 156/345.46, 345.47

See application file for complete search history.

(56) References Cited

U.S. PATENT DOCUMENTS

| | | | |
|---|---|---|---|
| 3,896,244 | A | 7/1975 | Ellis et al. |
| 4,891,247 | A | 1/1990 | Shamshoian |
| 5,120,568 | A | 6/1992 | Schuurmans et al. |
| 5,286,295 | A | 2/1994 | Sauvinet et al. |
| 5,300,189 | A | 4/1994 | Kokaku et al. |
| 5,368,897 | A * | 11/1994 | Kurihara et al. ............. 427/450 |
| 5,549,780 | A * | 8/1996 | Koinuma et al. ......... 156/345.39 |
| 5,560,777 | A * | 10/1996 | Ahn ......................... 118/723 E |

(Continued)

FOREIGN PATENT DOCUMENTS

| | | |
|---|---|---|
| CN | 1436602 A | 8/2003 |
| EP | 0188208 A2 | 7/1986 |

(Continued)

OTHER PUBLICATIONS

PCT Written Opinion, PCT Application No. PCT/KR2010/001076, Sep. 27, 2010, 8 pages.

(Continued)

*Primary Examiner* — Parviz Hassanzadeh
*Assistant Examiner* — Anna Crowell
(74) *Attorney, Agent, or Firm* — Fenwick & West LLP

(57) ABSTRACT

A vapor deposition reactor may include a first electrode including a first channel and at least one first injection hole connected to the first channel, a second electrode electrically separated from the first electrode, and a power source for applying power between the first electrode and the second electrode to generate plasma from a reactant gas between the first electrode and the second electrode. Also provided is a method for forming thin film using the vapor deposition reactor.

14 Claims, 14 Drawing Sheets

(56) References Cited

U.S. PATENT DOCUMENTS

| | | | |
|---|---|---|---|
| 5,565,249 A * | 10/1996 | Kurihara et al. | 427/577 |
| 5,578,130 A * | 11/1996 | Hayashi et al. | 118/723 E |
| 5,665,640 A | 9/1997 | Foster et al. | |
| 5,711,814 A | 1/1998 | Mori | |
| 5,820,947 A * | 10/1998 | Itoh | 427/577 |
| 5,863,337 A | 1/1999 | Neuman et al. | |
| 5,951,771 A | 9/1999 | Raney et al. | |
| 6,051,150 A * | 4/2000 | Miyakawa | 216/67 |
| 6,079,353 A | 6/2000 | Leksell et al. | |
| 6,099,974 A | 8/2000 | Lenling | |
| 6,143,077 A | 11/2000 | Ikeda et al. | |
| 6,319,615 B1 | 11/2001 | Jansen | |
| 6,354,109 B1 | 3/2002 | Boire et al. | |
| 6,406,590 B1 | 6/2002 | Ebata et al. | |
| 6,416,822 B1 | 7/2002 | Chiang et al. | |
| 6,424,091 B1 | 7/2002 | Sawada et al. | |
| 6,435,428 B2 | 8/2002 | Kim et al. | |
| 6,521,048 B2 | 2/2003 | Miller et al. | |
| 6,641,673 B2 | 11/2003 | Yang | |
| 6,656,831 B1 | 12/2003 | Lee et al. | |
| 6,730,614 B1 | 5/2004 | Lim et al. | |
| 6,972,055 B2 | 12/2005 | Sferlazzo | |
| 6,997,371 B2 | 2/2006 | Shabtay | |
| 7,886,688 B2 | 2/2011 | Takeuchi et al. | |
| 7,943,527 B2 | 5/2011 | Kumar et al. | |
| 8,257,799 B2 | 9/2012 | Lee | |
| 8,328,982 B1 * | 12/2012 | Babayan et al. | 156/345.43 |
| 2001/0047759 A1 * | 12/2001 | Matsui et al. | 118/723 E |
| 2002/0092616 A1 * | 7/2002 | Kim | 156/345.43 |
| 2002/0100418 A1 | 8/2002 | Sandhu et al. | |
| 2002/0112819 A1 | 8/2002 | Kamarehi et al. | |
| 2002/0197864 A1 | 12/2002 | Sneh | |
| 2003/0072881 A1 | 4/2003 | Yang et al. | |
| 2003/0143328 A1 | 7/2003 | Chen et al. | |
| 2003/0214043 A1 | 11/2003 | Saitoh et al. | |
| 2004/0052972 A1 | 3/2004 | Schmitt | |
| 2004/0067641 A1 | 4/2004 | Yudovsky | |
| 2004/0083967 A1 | 5/2004 | Yuda et al. | |
| 2004/0129212 A1 | 7/2004 | Gadgil et al. | |
| 2004/0171280 A1 | 9/2004 | Conley et al. | |
| 2004/0224527 A1 | 11/2004 | Sarigiannis et al. | |
| 2004/0247787 A1 | 12/2004 | Mackie et al. | |
| 2004/0261946 A1 | 12/2004 | Endoh et al. | |
| 2005/0016457 A1 | 1/2005 | Kawasaki et al. | |
| 2005/0064207 A1 | 3/2005 | Senzaki et al. | |
| 2005/0064236 A1 | 3/2005 | Lim et al. | |
| 2005/0106094 A1 | 5/2005 | Kondo | |
| 2005/0183768 A1 | 8/2005 | Roscheisen et al. | |
| 2006/0019033 A1 | 1/2006 | Muthukrishnan et al. | |
| 2006/0068519 A1 | 3/2006 | Dunbar et al. | |
| 2006/0183301 A1 | 8/2006 | Yeom et al. | |
| 2006/0211243 A1 | 9/2006 | Ishizaka et al. | |
| 2006/0213441 A1 | 9/2006 | Kobrin et al. | |
| 2006/0237399 A1 * | 10/2006 | Horner-Richardson et al. | 219/121.51 |
| 2006/0240665 A1 | 10/2006 | Kang et al. | |
| 2007/0082500 A1 | 4/2007 | Norman et al. | |
| 2007/0145023 A1 | 6/2007 | Holber et al. | |
| 2007/0224348 A1 | 9/2007 | Dickey et al. | |
| 2007/0237699 A1 | 10/2007 | Clark | |
| 2007/0243325 A1 | 10/2007 | Sneh | |
| 2007/0264488 A1 | 11/2007 | Lee | |
| 2007/0281082 A1 | 12/2007 | Mokhlesi et al. | |
| 2007/0281089 A1 | 12/2007 | Heller et al. | |
| 2008/0026162 A1 | 1/2008 | Dickey et al. | |
| 2008/0075881 A1 | 3/2008 | Won et al. | |
| 2008/0092953 A1 | 4/2008 | Lee | |
| 2008/0106202 A1 | 5/2008 | Du et al. | |
| 2008/0241387 A1 | 10/2008 | Keto | |
| 2008/0260963 A1 | 10/2008 | Yoon et al. | |
| 2009/0017190 A1 | 1/2009 | Sferlazzo et al. | |
| 2009/0044661 A1 | 2/2009 | Li et al. | |
| 2009/0068849 A1 | 3/2009 | Endo et al. | |
| 2009/0102385 A1 * | 4/2009 | Wi | 315/111.21 |
| 2009/0130858 A1 | 5/2009 | Levy | |
| 2009/0133714 A1 | 5/2009 | Yamazaki et al. | |
| 2009/0165715 A1 * | 7/2009 | Oh | 118/723 R |
| 2009/0170345 A1 | 7/2009 | Akae et al. | |
| 2009/0197406 A1 | 8/2009 | Cao et al. | |
| 2009/0291211 A1 | 11/2009 | Ryu et al. | |
| 2010/0037820 A1 | 2/2010 | Lee | |
| 2010/0037824 A1 | 2/2010 | Lee | |
| 2010/0055347 A1 | 3/2010 | Kato et al. | |
| 2010/0064971 A1 * | 3/2010 | Lee | 118/723 E |
| 2010/0124618 A1 | 5/2010 | Kobayashi et al. | |
| 2010/0181566 A1 | 7/2010 | Lee | |
| 2010/0189900 A1 | 7/2010 | Dickey et al. | |
| 2010/0215871 A1 | 8/2010 | Lee | |
| 2010/0255625 A1 | 10/2010 | De Vries | |
| 2010/0304047 A1 | 12/2010 | Yang et al. | |
| 2010/0310771 A1 | 12/2010 | Lee | |
| 2011/0070380 A1 | 3/2011 | Shero et al. | |
| 2012/0021252 A1 | 1/2012 | Lee | |
| 2012/0094149 A1 | 4/2012 | Lee | |
| 2012/0114877 A1 | 5/2012 | Lee | |
| 2012/0125258 A1 | 5/2012 | Lee | |
| 2012/0207948 A1 | 8/2012 | Lee | |
| 2012/0213945 A1 | 8/2012 | Lee | |
| 2012/0225204 A1 | 9/2012 | Yudovsky | |
| 2012/0301632 A1 | 11/2012 | Lee | |

FOREIGN PATENT DOCUMENTS

| | | | |
|---|---|---|---|
| EP | 0499524 A1 | | 2/1992 |
| FR | 2736632 A1 | | 1/1997 |
| JP | S62-081018 A | | 4/1987 |
| JP | H01-096924 A | | 4/1989 |
| JP | 1-161835 A | | 6/1989 |
| JP | 01161835 A | * | 6/1989 |
| JP | H01-223724 A | | 9/1989 |
| JP | H2-187018 A | | 7/1990 |
| JP | H04-092414 A | | 3/1992 |
| JP | H09-064000 A | | 3/1997 |
| JP | 09167757 A | * | 6/1997 |
| JP | 09-199738 A | | 7/1997 |
| JP | 11-092943 A | | 4/1999 |
| JP | 2001-357780 A | | 12/2001 |
| JP | 2002018276 A | * | 1/2002 |
| JP | 2003049272 A | * | 2/2003 |
| JP | 2003-073835 A | | 3/2003 |
| JP | 2003073835 A | * | 3/2003 |
| JP | 2003-174019 A | | 6/2003 |
| JP | 2003-324070 | | 11/2003 |
| JP | 2004-010949 A | | 1/2004 |
| JP | 2004/091837 A | | 3/2004 |
| JP | 2005-089781 A | | 4/2005 |
| JP | 2005-116898 | | 4/2005 |
| JP | 2005-347245 A | | 5/2005 |
| JP | 2006-236697 A | | 9/2006 |
| JP | 2007-019460 A | | 1/2007 |
| JP | 2007-191792 A | | 8/2007 |
| JP | 2007-266093 A | | 10/2007 |
| JP | 2008-108895 A | | 5/2008 |
| KR | 100175011 B1 | | 11/1998 |
| KR | 10-2001-0040561 | | 5/2001 |
| KR | 10-2002-0078804 | | 10/2002 |
| KR | 10-2002-0083564 A | | 11/2002 |
| KR | 10-0631972 | | 8/2003 |
| KR | 10-2004-0042209 A | | 5/2004 |
| KR | 10-2005-0015931 A | | 2/2005 |
| KR | 10-0542736 | | 1/2006 |
| KR | 10-2006-0117607 | | 11/2006 |
| KR | 10-0673211 B1 | | 1/2007 |
| KR | 10-2007-0051332 A | | 5/2007 |
| KR | 10-2007-0076955 A | | 7/2007 |
| KR | 10-2007-0096770 A | | 10/2007 |
| KR | 10-2007-0101127 A | | 10/2007 |
| KR | 10-2007-0101360 A | | 10/2007 |
| KR | 10-0771926 A | | 10/2007 |
| KR | 10-2008-0067042 A | | 7/2008 |
| WO | WO 2006/054854 A1 | | 5/2006 |
| WO | WO 2007/134322 A2 | | 11/2007 |

(56) References Cited

FOREIGN PATENT DOCUMENTS

| WO | WO 2008/130369 A1 | 10/2008 |
|---|---|---|
| WO | WO 2009/031886 A2 | 3/2009 |
| WO | WO 2010/138102 A1 | 12/2010 |

OTHER PUBLICATIONS

U.S. Appl. No. 13/185,793, filed Jul. 19, 2011, Inventor: Sang In Lee.
U.S. Appl. No. 13/273,076, filed Oct. 13, 2011, Inventor: Sang In Lee.
U.S. Appl. No. 13/285,417, filed Oct. 31, 2011, Inventor: Sang In Lee.
U.S. Appl. No. 13/295,012, filed Nov. 11, 2011, Inventor: Sang In Lee.
PCT International Search Report and Written Opinion, PCT Application No. PCT/US11/44470, Dec. 7, 2011, 13 pages.
Dameron, A.A. et al., "Molecular Layer Deposition of Alucone Polymer Films Using Trimethylaluminum and Ethylene Glycol," Chem. Mater., 2008, pp. 3315-3326, vol. 20.
PCT Invitation to Pay Additional Fees, PCT Application No. PCT/US12/25095, May 22, 2012, 2 pages.
PCT International Search Report and Written Opinion, PCT Application No. PCT/US12/25483, May 29, 2012, 10 pages.
U.S. Appl. No. 13/369,717, filed Feb. 9, 2012, Inventor: Sang In Lee.
U.S. Appl. No. 13/397,590, filed Feb. 15, 2012, Inventor: Sang In Lee.
PCT International Search Report and Written Opinion, PCT Application No. PCT/US2011/056285, Mar. 8, 2012, 11 pages.
PCT International Search Report and Written Opinion, PCT Application No. PCT/US11/58552, Mar. 14, 2012, 12 pages.
PCT International Search Report and Written Opinion, PCT Application No. PCT/US2011/060474, Mar. 22, 2012, 12 pages.
European Extended Search Report, European Application No. 10786646.9, Nov. 29, 2012, 17 pages.
PCT International Search Report and Written Opinion, PCT Application No. PCT/US12/25095, Aug. 3, 2012, 18 pages.
He, G. et al., "Metal-Organic Chemical Vapor Deposition of Aluminum Oxynitride from Propylamine-Dimethylaluminum Hydride and Oxygen: Growth Mode Dependence and Performance Optimization," Journal of Materials Chemistry, 2012, pp. 7468-7477, vol. 22.
Zhu, M. et al., "Aluminum Oxynitride Interfacial Passivation Layer for High-Permittivity Gate Dielectric Stack on Gallium Arsenide," Applied Physics Letters, 202903, 2006, pp. 1-3, vol. 89.
Choi, J. M. et al., "Ultraviolet Enhanced Si-Photodetector Using p-NiO Films," Applied Surface Science, May 15, 2005, pp. 435-438, vol. 244, No. 1-4.
European Extended Search Report, European Application No. 10733634.9, Jan. 30, 2013, 5 pages.
Hermle, M. et al., "Analyzing the Effects of Front-Surface Fields on Back-Junction Silicon Solar Cells Using the Charge-Collection Probability and the Reciprocity Theorem," Journal of Applied Physics, Mar. 10, 2008, 7 pages, vol. 103, No. 5.
Kymakis, E. et al., "Bi-Layer Photovoltaic Devices with PPQ as the Electron Acceptor Layer," Solar Energy Materials & Solar Cells, Jul. 24, 2006, pp. 1705-1714, vol. 90, No. 12.
Verlinden, P. et al., "Measurement of Diffusion Length and Surface Recombination Velocity in Interdigitated Back Contact (IBC) and Front Surface Field (FSF) Solar Cells," Physica, 1985, pp. 317-321, vol. 129, No. 1-3.
Yoshikawa. O. et al., "Enhanced Efficiency and Stability in P3HT:PCBM Bulk Heterojunction Solar Cell by Using TiO2 Hole Blocking Layer," Mater. Res. Soc. Symp. Proc., Materials Research Society, Jan. 2007, 6 pages.
Chinese First Office Action, Chinese Application No. 201080025311.3, Jun. 25, 2013, 14 pages.
Japanese First Office Action, Japanese Application No. 2012-514229, Jul. 17, 2013, 8 pages.
European Examination Report, European Patent Application No. 10786646.9, Oct. 24, 2013, 5 pages.
Maydannik, P.S. et al., "An Atomic Layer Deposition Process for Moving Flexible Substrates," Chemical Engineering Journal, 2011, pp. 345-349, vol. 171.
Taiwan Office Action, Taiwan Application No. 100126066, Oct. 8, 2013, 14 pages.

\* cited by examiner

Movement direction of substrate

VAPOR DEPOSITION REACTOR USING PLASMA AND METHOD FOR FORMING THIN FILM USING THE SAME

BACKGROUND

1. Field

This disclosure relates to a vapor deposition reactor using plasma and a method for forming thin film using the same.

2. Description of the Related Art

During chemical vapor deposition (CVD) or atomic layer deposition (ALD), simultaneous application of precursors and plasma is often required. Plasma may be generated by applying voltage between two or more electrodes facing each other. FIG. 1 is a cross-sectional view of a conventional direct plasma type vapor deposition reactor. The direct plasma type vapor deposition reactor includes a chamber 106, a pair of electrodes 101, 102 located in the chamber 106 and spaced apart from each other, and a power source 103. By applying voltage between the pair of electrodes 101, 102 by means of the power source 103, plasma may be generated between the pair of electrodes 101, 102 and applied to a substrate 100. Further, a source precursor or a reactant precursor may be injected onto the substrate 100 through an injection hole 104 of the chamber 106. The source precursor or the reactant precursor may be discharged out of the chamber 106 through an exhaust hole 105.

By using the vapor deposition reactor as illustrated in FIG. 1, a thin film with relatively superior density characteristics may be obtained compared to the thin film produced by thermal decomposition. In addition, the vapor deposition reactor of FIG. 1 allows a low temperature process using plasma.

However, the substrate 100 may be damaged and decomposition by-products may be mixed into the thin film because the plasma is directly applied onto the substrate 100. For example, when a metal-organic source is used, a large quantity of carbon may be generated. Also, to generate capacitive type plasma, a low pressure or high vacuum is required. However, the plasma generated by a high voltage may result in the generation of particles or deterioration of the film property because of the generation of fine arc. Finally, when a pulse power is applied from the power source 103 for the purpose of ALD, the plasma may not be stabilized in short time, particles may be generated due to the repeated switching on and off of the plasma, which increases reflected power.

FIG. 2 is a cross-sectional view of a conventional remote plasma type vapor deposition reactor. The vapor deposition reactor of FIG. 2 includes a chamber 206, a first coil 201 and a second coil 202 located outside the chamber 206 and spaced apart from each other, and a power source 203. When using inductively couple plasma, the first coil 201 and the second coil 202 may be a single winding coil. When power is applied between the first coil 201 and the second coil 202 from the power source 203, plasma may be generated at a location distant from a substrate 200 and then applied to the substrate 200 as remote plasma. Further, a source precursor or a reactant precursor may be injected onto the substrate 200 through an injection hole 204 of the chamber 206.

With the remote plasma type vapor deposition reactor reduces the damage of the substrate 200 because the plasma is generated at a location distant from the substrate 200. In addition, the remote plasma enables a low temperature process. However, a thin film may not be formed uniformly across the center of the substrate 200 to its edge because the plasma is applied non-uniformly to the substrate 200. Further, the volume of the chamber 206 needs to be increased to uniformly inject the source precursor or the reactant precursor to the substrate 200, which results in increased consumption of the source precursor or the reactant precursor.

U.S. Pat. No. 6,435,428 discloses a showerhead type reactor equipped with a plasma generating apparatus. The reactor of this patent has a plasma generating electrode inside a showerhead. A source gas and a reactant gas excited by plasma are injected into a chamber so that thin film is formed by radical-assisted CVD or ALD. The reactor of U.S. Pat. No. 6,435,428, however, requires the use of an insulator such as ceramic for the showerhead in order to apply the plasma. In addition, the inside of the showerhead needs to be insulated for electrical isolation of the source gas and the reactant gas while requiring an electrode for generating plasma. Moreover, an O-ring has to be used to prevent leakage of gas between parts because the showerhead is assembled using ceramic parts that are not welded for insulation. This may result in deterioration of reliability and durability.

Further, with the reactor of U.S. Pat. No. 6,435,428, plasma can be generated only at the reactant gas because the source gas may be decomposed and deposited by the plasma. Accordingly, in order to prevent the effect of plasma when the source gas passes through a channel of the reactant gas, a gas injection tube made of insulating material such as ceramic or quartz is inserted in an upper plate above the electrode. In this case, if the materials of the showerhead and the gas injection tube have different thermal expansion coefficients or if there is a gap between the tubes, the source gas may flow into the channel for plasma generation and may be deposited inside the showerhead. The deposition around the tube may result in disconnection between electrodes when thin films made of metal or the like is to be formed, thereby making it impossible to generate plasma.

SUMMARY

Embodiments provide a vapor deposition reactor capable of generating plasma between electrodes as well as injecting a material such as a source precursor or a reactant precursor onto a substrate using an electrode for plasma generation. The vapor deposition reactor may include a first electrode including a first channel and at least one first injection hole connected to the first channel, a second electrode electrically separated from the first electrode, and a power source for applying voltage between the first electrode and the second electrode to generate plasma from a reactant gas between the first electrode and the second electrode.

In one embodiment, the first channel includes a plurality of channels separated from each other.

In one embodiment, the second electrode includes a second channel, and at least one second injection hole connected to the second channel. Further, the second channel includes a plurality of channels separated from each other.

In one embodiment, at least one of the first electrode and the second electrode has a protrusion projecting between the first electrode and the second electrode.

In one embodiment, the first electrode or the second electrode includes a platform extending in a longitudinal direction. The first electrode or the second electrode also includes a protrusion thread extending on the surface of the platform in the longitudinal direction in a spiraled manner.

In one embodiment, first electrode including a first channel and at least one first injection hole connected to the first channel and a second electrode in proximity to each other are disposed. Electric voltage is applied between the first electrode and the second electrode to generate plasma from a reactant gas between the first electrode and the second electrode. The substrate is moved towards the first electrode and the second electrode. A material is injected to the substrate through the at least one first injection hole.

In one embodiment, when the second electrode includes a second channel and at least one second injection hole connected to the second channel, a material is injected to the substrate through the at least one second injection hole.

DETAILED DESCRIPTION

Figure 1:
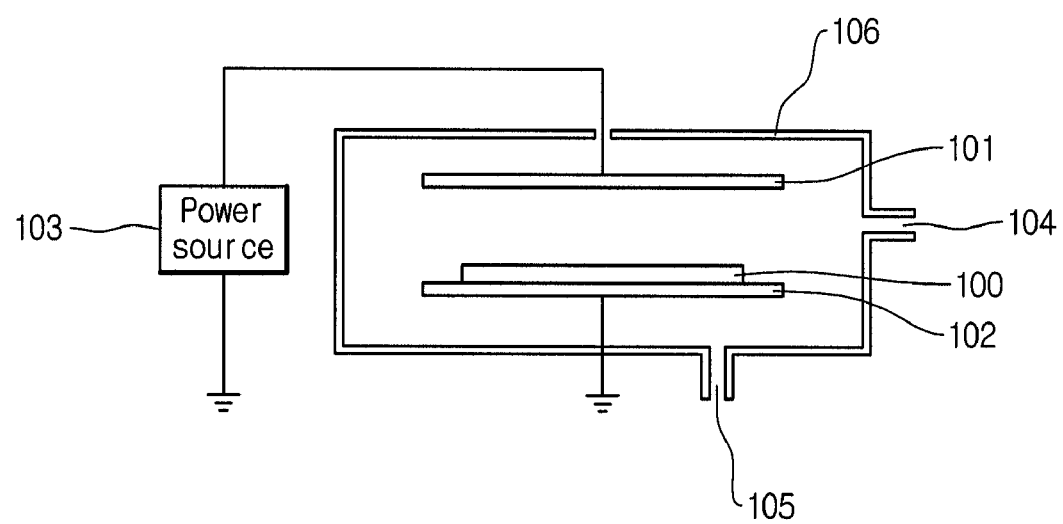
FIG. 1 is a cross-sectional view of a conventional vapor deposition reactor.
Figure 2:
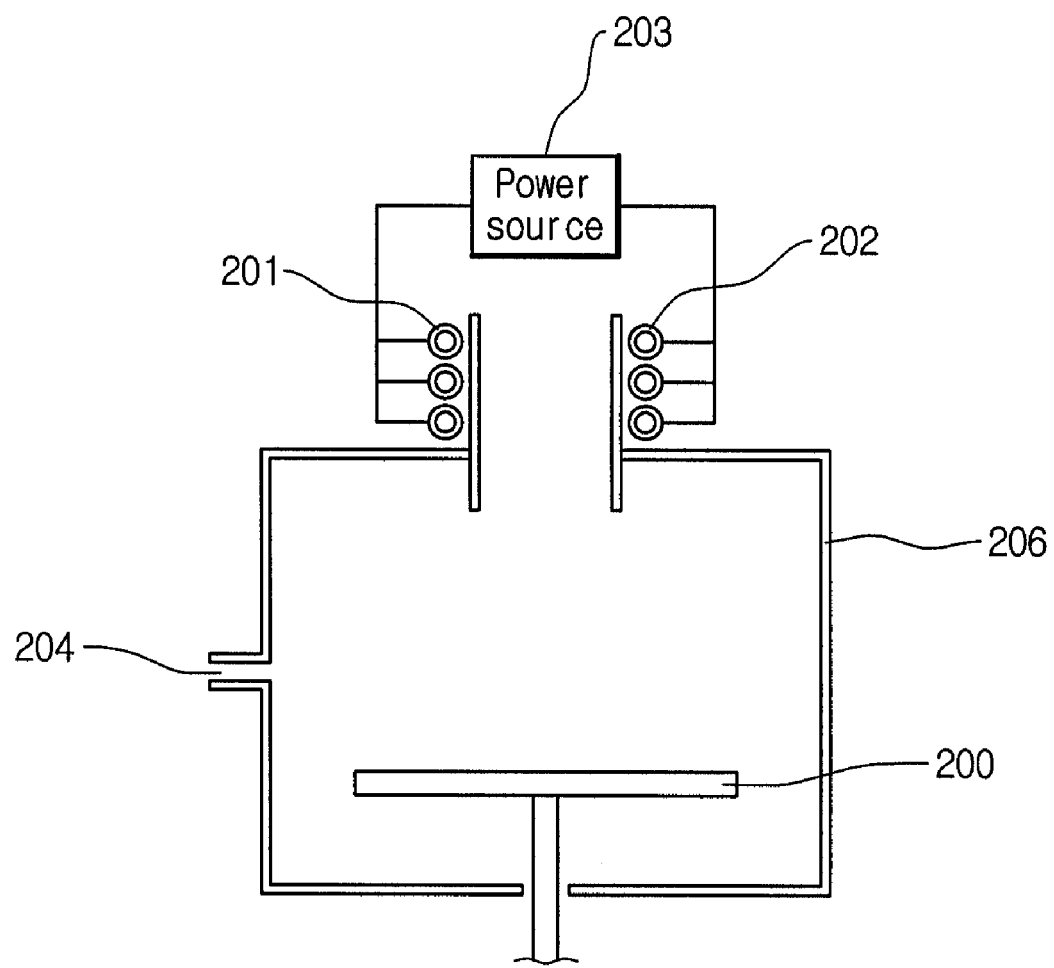
FIG. 2 is a cross-sectional view of another conventional vapor deposition reactor.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Figure 3:
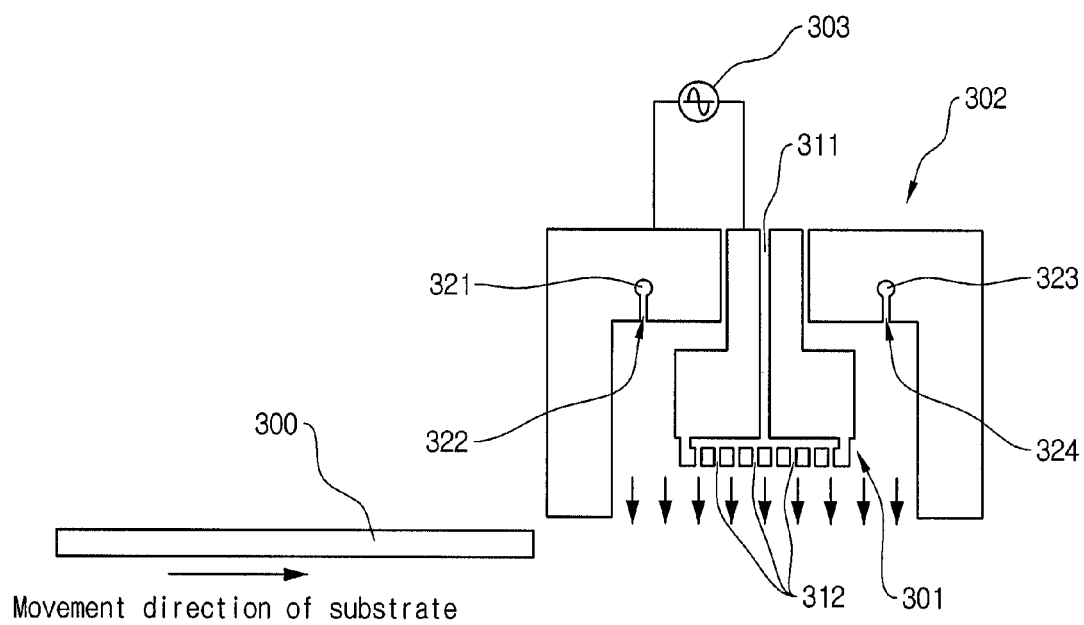
FIG. 3 is a cross-sectional view of a vapor deposition reactor according to an example embodiment.

FIG. 3 is a cross-sectional view of a vapor deposition reactor according to an example embodiment. The vapor deposition reactor may include, among other components, a first electrode 301, a second electrode 302 and a power source 303. The first electrode 301 and the second electrode 302 may be electrically separated from each other, for example, by way of spatially separating the first electrode 301 and the second electrode 302. Alternatively, if the first electrode 301 and the second electrode 302 need to be in contact with each other in one or more regions, ceramic such as $Al_2O_3$ may be interposed between the first electrode 301 and the second electrode 302 to insulate them. In an example embodiment, the first electrode 301 is positioned inside the second electrode 302 so that the second electrode 302 encloses the first electrode 301.

The first electrode 301 and the second electrode 302 may be made of suitable conductive material such as metal. Further, when plasma using dielectric barrier discharge is to be generated, a dielectric material may be inserted between the first electrode 301 and the second electrode 302 or coated on the first electrode 301 and the second electrode 302. For example, the first electrode 301 and the second electrode 302 may be made of stainless steel, Inconel, nickel (Ni), aluminum (Al), refractory metal, conductive silicon (Si) doped with dopants, anodized Al, metal or conductive Si coated with a dielectric (e.g. $SiO_2$, $Al_2O_3$, SiN), or the like.

If there is a risk that the material of the first electrode 301 or the second electrode 302 may be mixed into a thin film during the formation of the thin film, the first electrode 301 and the second electrode 302 may be made of the same material as that of the thin film. For example, when a NiO thin film is to be formed, the first electrode 301 and the second electrode 302 may be made of Ni or Ni alloy. Further, when a $SiO_2$ or SiN thin film is to be formed, the first electrode 301 and the second electrode 302 may be made of silicon. In that case, the silicon may be doped with boron (B) or phosphorus (P) in order to provide conductivity.

A channel 311 and at least one injection hole 312 connected to the channel 311 may be formed in the first electrode 301. The channel 311 is formed inside the first electrode 301 and serves to transport a material injected from an outside source. The at least one injection hole 312 connected to the channel 311 may be formed on the surface of the first electrode 301. The injection hole 312 serves to inject the material transported through the channel 311 from the first electrode 301 to a substrate 300 below.

The material injected through the injection hole 312 to the substrate 300 may be a source precursor or a reactant precursor for chemical vapor deposition (CVD) or atomic layer deposition (ALD). Alternatively, the material injected through the injection hole 312 to the substrate 300 may be a purge gas consisting of an inert material or a reactant gas for plasma generation.

The vapor deposition reactor and the substrate 300 may be configured such that the material is injected onto the substrate 300 as the vapor deposition reactor and the substrate 300 move relatively to each other. For example, as illustrated in FIG. 3, the substrate 300 may pass below the first electrode 301 and the second electrode 302 from the left to the right. As the substrate 300 passes the first electrode 301, the material may be injected onto the substrate 300 through the at least one injection hole 312. The motion of the substrate 300 relative to the first electrode 301 and the second electrode 302 may be a linear or rotational motion.

In another example embodiment, the material may be injected onto the substrate 300 as the first electrode 301 and the second electrode 302 move relative to the substrate 300 instead of moving the substrate 300.

Using the vapor deposition reactor, plasma can be generated between the first electrode 301 and the second electrode 302 and applied to the substrate 300 in addition to injecting a material to the substrate 300 through the injection hole 312 of the first electrode 301. For this purpose, a voltage may be applied by the power source 303 between the first electrode 301 and the second electrode 302. In order to generate the plasma, the power source 303 may apply a direct current (DC), a pulse and/or radio frequency (RF) voltage pattern.

For example, if the power source 303 applies a pulse power, the pulse power may have a frequency of about 10 Hz to about 1 kHz. Further, the pulse power may have a frequency of about 100 kHz to about 60 MHz. The pulse power may have an output amplitude of about 100 W to about 500 W. Further, a plasma generation time may be controlled by controlling the on/off ratio (duty ratio) of the pulse voltage applied by the power source 303.

Between the first electrode 301 and the second electrode 302, a reactant gas for plasma generation may be injected in advance. When voltage is applied by the power source 303 between the first electrode 301 and the second electrode 302, plasma may be generated from the reactant gas. For example, as illustrated in FIG. 3, plasma may be generated between a side surface of the first electrode 301 and an inner side surface of the second electrode 302. In this case, plasma is generated along a direction parallel to the moving direction of the substrate 300, and, therefore, the damage of the substrate 300 due to the plasma may be reduced or prevented. Further, by constructing the side surface of the first electrode 301 to protrude more than a lower portion of the injection hole 312, it is possible to prevent the plasma from diffusing into the source precursor injected through the injection hole 312.

In the example embodiment illustrated in FIG. 3, the surface of the first electrode 301 and the second electrode 302 is flat so as to generate capacitive type plasma. However, a low pressure of about 1 Ton or lower is required to generate the capacitive type plasma, and it is difficult to generate the capacitive type plasma at an atmospheric pressure. At an atmospheric pressure or a relatively high pressure (e.g., above about 100 Ton), plasma using dielectric barrier discharge (DBD) or pulse corona discharge may be generated. In this case, the first electrode 301 and the second electrode 302 may have at least one protrusion (not shown) for generating plasma using DBD or pulse corona discharge on its surfaces facing the other electrode.

In an example embodiment, at least one channel and at least one injection hole respectively connected to the channel are formed in the second electrode 302. For example, a first channel 321, at least one first injection hole 322 connected to the first channel 321, a second channel 323, and at least one second injection hole 324 connected to the second channel 323 may be formed in the second electrode 302. The first channel 321 and the second channel 323 may be spatially separated from each other.

A material injected into the first channel 321 from an outside source may be conveyed through the first channel 321 and ejected from the second electrode 302 through the first injection hole 322. Similarly, a material conveyed through the second channel 323 may be ejected from the second electrode 302 through the second injection hole 324. Accordingly, materials may be injected through the first injection hole 322 and the second injection hole 324 of the second electrode 302 to the substrate 300 below.

The materials injected through the first and second injection holes 322, 324 may be identical to or different from the material injected through the injection hole 312 of the first electrode 301. Further, the materials injected through the first and second injection holes 322, 324 may be identical to or different from each other. In an example embodiment, materials may be injected through the first injection hole 322 and the second injection hole 324 with a time delay.

For example, if it is desirable to form an atomic layer on the substrate 300 by means of ALD, a reactant precursor may be injected through the first and second injection holes 322, 324 of the second electrode 302 to the substrate 300, and a source precursor may be injected through the injection hole 312 of the first electrode 301 to the substrate 300. Since plasma may be generated between the first electrode 301 and the second electrode 302, the material injected from the injection holes 322, 324 of the second electrode 302 may be excited and/or decomposed by the plasma before reaching the substrate 300. Accordingly, by reacting the reactant precursor excited and/or decomposed by the plasma with the source precursor, a thin film with an improved conformity may be formed.

In an example embodiment, a purge gas may be injected onto the substrate 300 through the injection holes 322, 324. For example, the purge gas may include an inert material such as nitrogen ($N_2$), argon (Ar), helium (He), neon (Ne), or the like. Alternatively, a reactant gas for plasma generation may be injected through the injection holes 322, 324. In this case, power may be applied to the reactant gas injected through the injection holes 322, 324 to generate plasma between the first electrode 301 and the second electrode 302.

In the example embodiment illustrated in FIG. 3, the channels 321, 323 of the second electrode 302 extend along a direction perpendicular to the longitudinal direction that channel 311 of the first electrode 301 extends, and thus, a cross-section of the channels 321, 323 along the length direction may be illustrated as FIG. 3. The configuration of the channels 321, 323 illustrated in FIG. 3 is merely an example. The direction the channels 321, 323 extend may be different from that illustrated in FIG. 3. For example, the channels 321, 323 may extend in the same direction as the channel 311 or may extend to have a certain angle with respect to the direction that the channel 311 extends. Also, although the injection holes 322, 324 illustrated in FIG. 3 are located at the upper portion of the second electrode 301, they may be located at different positions in the second electrode 301 according to other example embodiments.

With the vapor deposition reactor described above, it is possible to inject a material onto the substrate 300 through the injection hole 312 of the first electrode 301, while generating plasma between the first electrode 301 and the second electrode 302. In addition, it is possible to inject a material to the substrate 300 through the injection holes 322, 324 of the second electrode 302. Accordingly, by applying a material to the substrate 300 after decomposing and/or exciting it by the plasma, a thin film with improved conformity may be formed.

Figure 4:
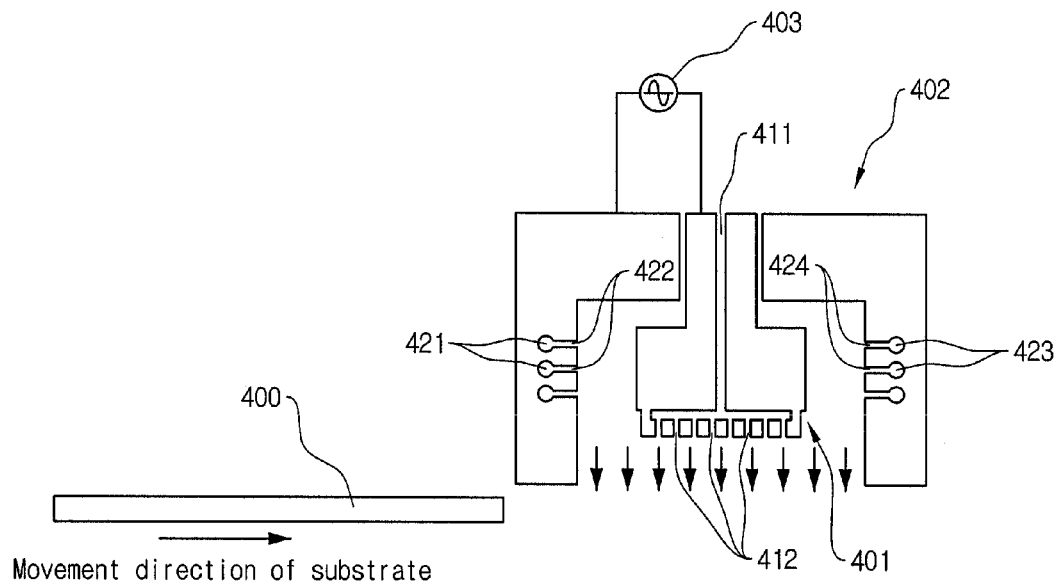
FIG. 4 is a cross-sectional view of a vapor deposition reactor according to another example embodiment.

FIG. 4 is a cross-sectional view of a vapor deposition reactor according to another example embodiment. The injection holes 422, 424 of a second electrode 402 of the vapor deposition reactor may be located along the side surfaces of the second electrode 402. That is, the injection holes 422, 424 of the second electrode 402 may be located in proximity to a region where plasma is generated between a first electrode 401 and the second electrode 402. The configuration and function of the vapor deposition reactor illustrated in FIG. 4 is apparent from FIG. 4, and therefore, a detailed description thereof will be omitted for the purpose of brevity.

Figure 5A:
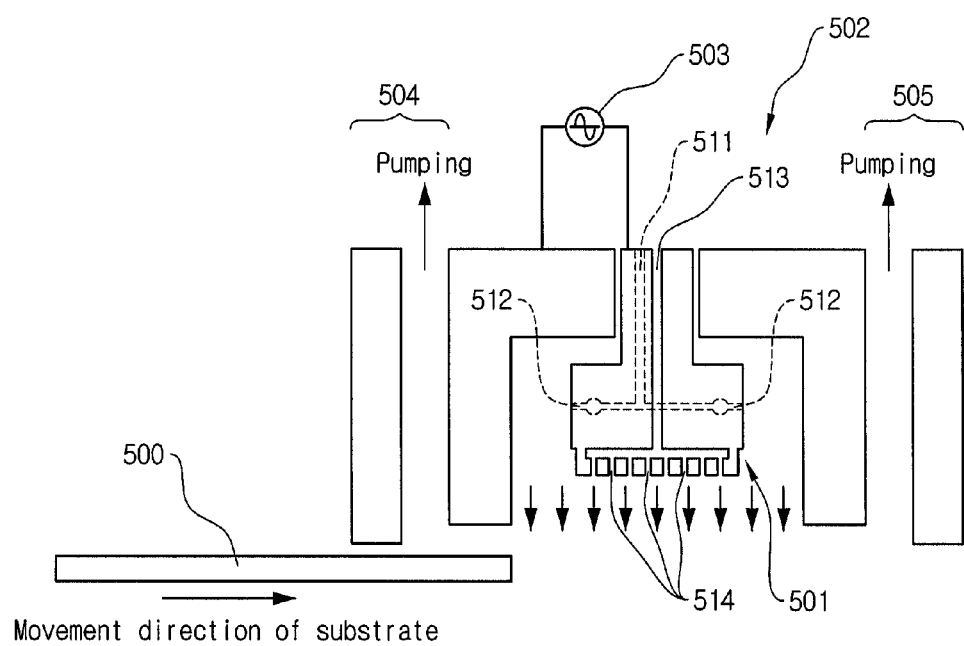
FIG. 5A is a cross-sectional view of a vapor deposition reactor according to another example embodiment.
Figure 5B:
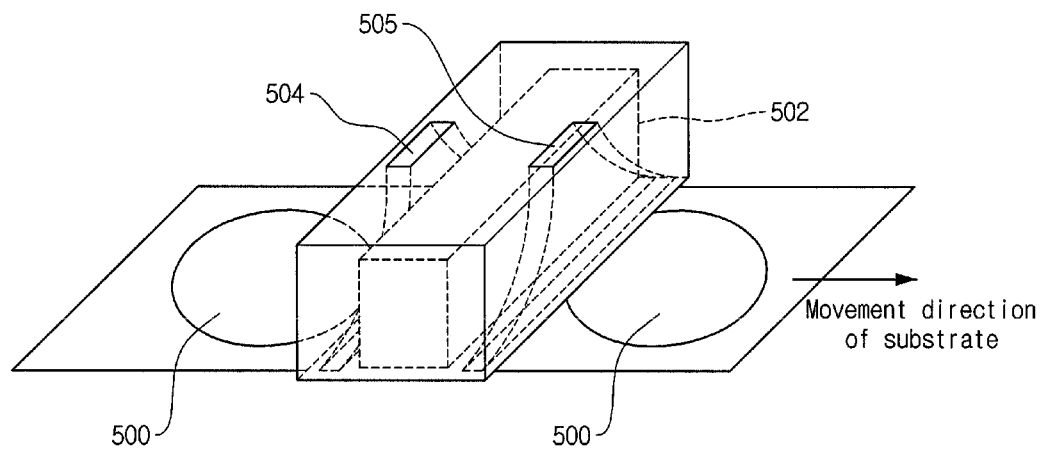
FIG. 5B is a perspective view of the vapor deposition reactor of FIG. 5A.

FIG. 5A is a cross-sectional view of a vapor deposition reactor according to another example embodiment, and FIG. 5B is a perspective view of the vapor deposition reactor of FIG. 5A. The vapor deposition reactor of FIGS. 5A and 5B may include a first electrode 501, a second electrode 502, a power source 503, and exhaust units 504, 505. The first electrode 501 may comprise a first channel 511, at least one first injection hole 512 connected to the first channel 511, a second channel 513, and at least one second injection hole 514 connected to the second channel 513.

Materials conveyed through the first and second channels 511, 513 may be identical to or different from each other. Accordingly, the materials injected through the first and second injection holes 512, 514 may be identical to or different from each other. For example, if the vapor deposition reactor is employed for ALD, a reactant precursor may be injected to a substrate 500 through the first injection hole 512, and a source precursor may be injected to the substrate 500 through the second injection hole 514.

When voltage is applied by the power source 503 between the first electrode 501 and the second electrode 502, plasma may be generated between the first electrode 501 and the second electrode 502. In an example embodiment, plasma may be generated at a region in proximity to the first injection hole 512 of the first electrode 501 and may decompose and/or excite the reactant precursor injected through the first injection hole 512.

The exhaust units 504, 505 serve to discharge impurities, residual precursors, or the like adsorbed in the substrate 500. For example, the exhaust unit 504 may remove impurities adsorbed on the surface of the substrate 500 moving from the left by means of pumping. Further, the exhaust unit 505 may remove residual precursors adsorbed on the surface of the substrate 500 while the substrate 500 passes the first electrode 501 and the second electrode 502. For this purpose, the pressure in a space inside the exhaust units 504, 505 may be lower than the pressure of the region in proximity to the first electrode 501 and the second electrode 502. Further, the surface of the exhaust units 504, 505 may be curved to provide high conductance.

In the example embodiment illustrated in FIG. 5A, the first electrode 501 comprises the channels 511, 513 and the injection holes 512, 514. The embodiment of FIG. 5A is merely an example, and any one of the first electrode 501 and the second electrode 502 may comprise at least one channel and injection hole connected thereto, or both of the first electrode 501 and the second electrode 502 may comprise at least one channel and injection hole connected thereto.

Further, the exhaust units 504, 505 may be equipped not only in the vapor deposition reactor according to the example embodiment illustrated in FIG. 5A but also in other vapor deposition reactors according to other example embodiments.

Figure 6A:
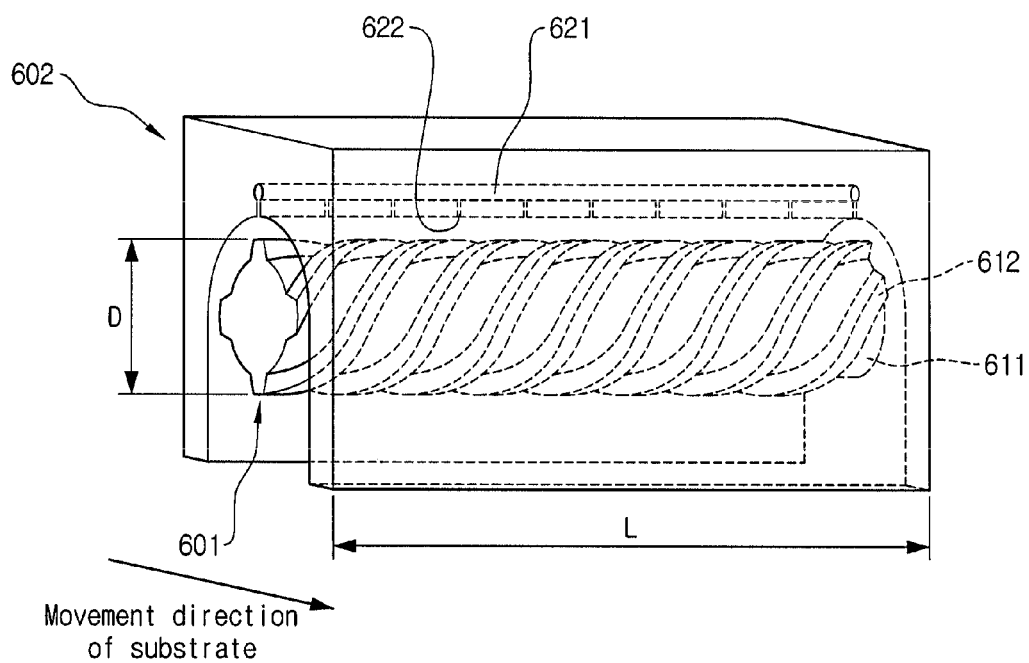
FIG. 6A is a perspective view of a vapor deposition reactor according to another example embodiment.
Figure 6B:
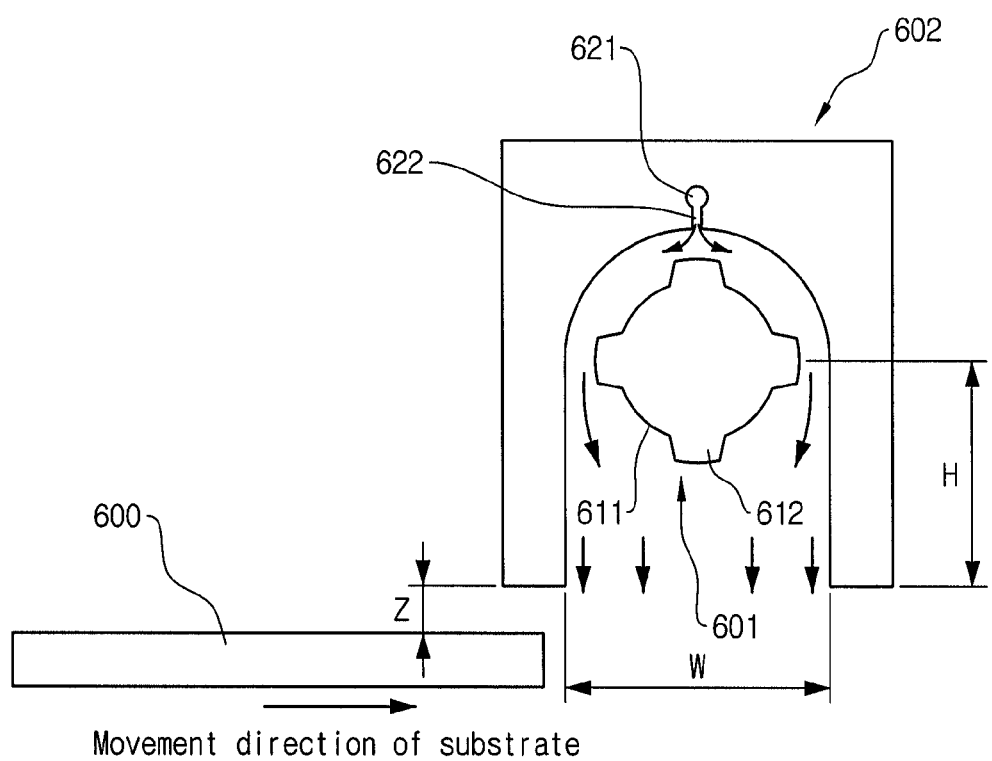
FIG. 6B is a cross-sectional view of the vapor deposition reactor of FIG. 6A.

FIG. 6A is a perspective view of a vapor deposition reactor according to another example embodiment. FIG. 6B is a cross-sectional view of the vapor deposition reactor of FIG. 6A. The vapor deposition reactor of FIGS. 6A and 6B may comprise, among other components, a first electrode 601, a second electrode 602, and a power source (not shown). The first electrode 601 may comprise a platform 611 extending along a longitudinal direction, and at least one protrusion 612 formed on the periphery of the platform 611 to extend spirally along the length of the platform 611. For example, the platform 611 may have a cylindrical shape with the spiral protrusion 612.

The platform 611 and the protrusion 612 of the first electrode 601, and the second electrode 602 may be made of a suitable conducting material such as metal. The material of the first electrode 601 and the second electrode 602 may be identical to that of the first electrode 301 and the second electrode 302 described above with reference to FIG. 3. Therefore, a detailed description thereof will be omitted for the purpose of brevity.

In the example embodiment illustrated in FIGS. 6A and 6B, the number of the protruding thread 612 is four. This is merely an example, and the number of the protrusion 612 may be larger or smaller. Further, although the protruding threads 612 are illustrated in FIG. 6B as being disposed on the periphery of the platform 611 with the same angular interval, this is merely an example. In another example embodiment, the spacing between the protruding threads 612 may not be the same.

The second electrode 602 may extend along the length of the first electrode 601 and may be disposed to enclose the first electrode 601. For example, the second electrode 602 may be hollow, and the first electrode 601 may be located in the hollow space of the second electrode 602.

The surface of the second electrode 602 facing the first electrode 601 may have, at least in part, a shape corresponding to the surface shape of the first electrode 601. For example, if the first electrode 601 has a cylindrical shape with protrusions, the cross-section of the second electrode 602 in a direction perpendicular to the length direction of the first electrode 601 may have, at least in part, a shape concentric with the cross-section of the cylindrical shape. As a result, plasma may be generated uniformly between the first electrode 601 and the second electrode 602. Alternatively, in another example embodiment, the first electrode 601 and the second electrode 602 may have different cross-sectional shapes.

At least one channel 621 may be formed inside the second electrode 602. A material injected from an outside source into the channel 621 may be conveyed through the channel 621 and ejected from the second electrode 602 through at least one injection hole 622. The at least one injection hole 622 may be located with intervals along the length of the second electrode 602. The material injected through the injection hole 622 may be a reactant precursor or a source precursor for ALD. Further, the material injected through the injection hole 622 may be a purge gas including an inert material, or a reactant gas for plasma generation.

Reaction characteristics may be determined depending on various parameters, including a length L of the first electrode 601 and the second electrode 602, a gap Z between the second electrode 602 and a substrate 600, a width W of an opening of the second electrode 602, a height H at which the first electrode 601 is located, a moving speed of the substrate 600, or the like. Therefore, these parameters may be determined appropriately based on the size and kind of the substrate 600, the kind of materials used for thin film formation, the desired characteristics of thin film, or the like.

For example, the first electrode 601 may have a cross-sectional diameter D of about 50 mm to about 100 mm. The opening of the second electrode 602 may have a width W of about 60 mm to about 120 mm. And, the gap Z between the second electrode 602 and the substrate 600 may be about 0.1 mm to about 5 mm. For example, the gap Z may be about 1 mm.

The length L of the first electrode 601 and the second electrode 602 may be made larger than a width of the substrate 600 so that the thin film formed on the substrate 600 may have a sufficient conformity. For example, if a thin film is to be formed on a substrate 600 having a width of 300 mm, the length L of the first electrode 601 and the second electrode 602 may be about 350 mm or smaller.

Space below the first electrode 601 is a reaction area for forming the thin film on the substrate 600. Accordingly, the height H at which the first electrode 601 is located may be appropriately determined depending on the desired size of the reaction space. If the vapor deposition reactor is employed for CVD, the height H at which the first electrode 601 is located may be about 10 mm to about 100 mm. Further, if the vapor deposition reactor is employed for ALD, the height H at which the first electrode 601 is located may be about 10 mm to about 50 mm.

Further, the size of the reaction space and the injection amount of materials may be controlled so that the pressure of the whole apparatus is about 1 Torr to atmospheric pressure. In this case, partial pressure of oxygen may be about 10-6 Torr or lower. The temperature of the substrate 600 may be about 200° C. to about 400° C., and the moving speed of the substrate 600 may be about 10 cm/min to about 100 cm/min.

These reaction conditions are merely illustrative. These parameters and other parameters associated with thin film formation may be determined appropriately based on the kind of material, the desired characteristics of thin film, or the like.

When voltage is applied between the first electrode 601 and the second electrode 602, plasma using DBD or pulse corona discharge may be generated at a region where the at least one protrusion 612 of the first electrode 601 overlap with the second electrode 602. Since the protrusion 612 is formed in a spiral shape, a plasma generation region also has a spiral shape.

By configuring the first electrode 601 using the platform 611 and the protruding thread 612 extending formed on the platform 611 extending longitudinally in a spiraled manner, a quantity of plasma generated per unit length of the first electrode 601 may be increased. Further, since the distribution of the plasma generation region is affected by the number of the protrusion 612, the number of spirals of the protrusion 612 per unit length of the platform 611 (i.e., density of the protrusion 612), the disposition angle of the protrusion 612 with respect to the second electrode 602, or the like, plasma conformity may be controlled by controlling the number and arrangement of the protrusion 612.

Using the vapor deposition reactor, it is possible to inject a material such as a source precursor or a reactant precursor to the substrate 600 through the injection hole 622 of the second electrode 602, while generating plasma between the first electrode 601 and the second electrode 602. Accordingly, by applying a material to the substrate 600 after decomposing and/or exciting it by the plasma, a thin film with an improved conformity may be formed.

Figure 7A:
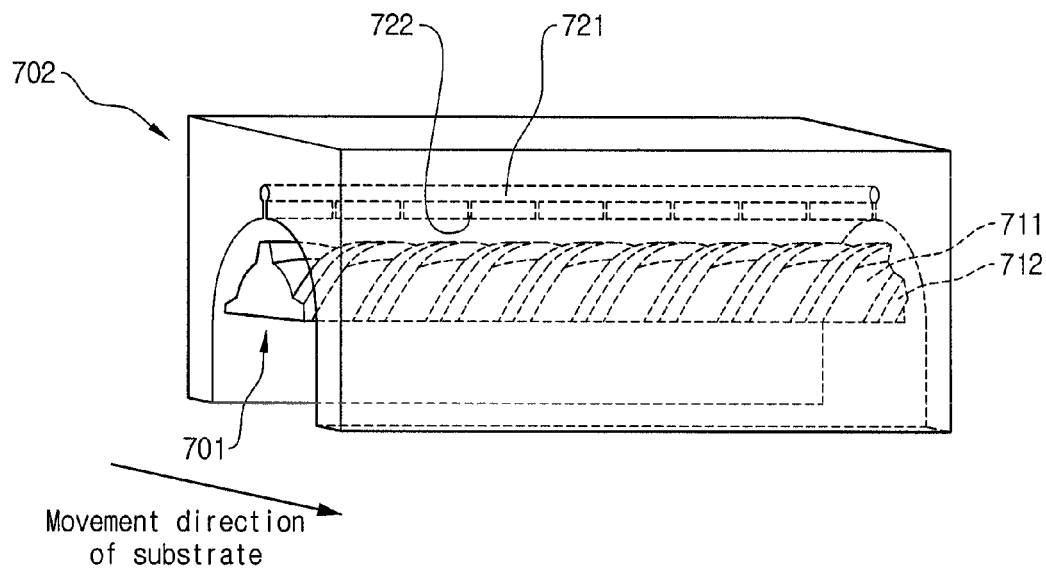
FIG. 7A is a perspective view of a vapor deposition reactor according to another example embodiment.
Figure 7B:
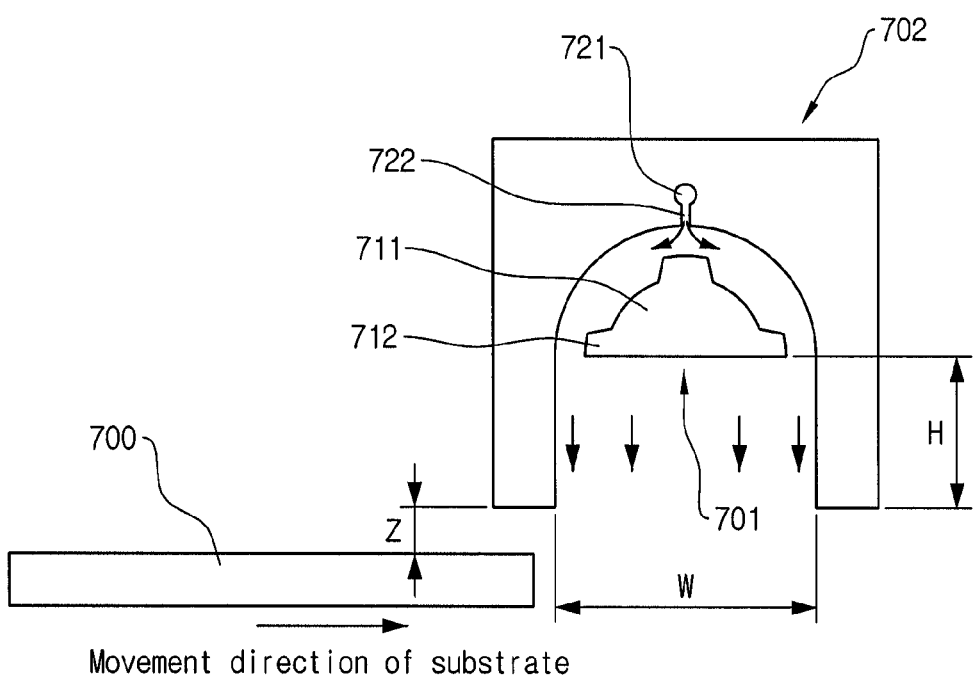
FIG. 7B is a cross-sectional view of the vapor deposition reactor of FIG. 7A.

FIG. 7A is a perspective view of a vapor deposition reactor according to another example embodiment, and FIG. 7B is a cross-sectional view of the vapor deposition reactor of FIG. 7A. A lower portion of a first electrode 701 in FIG. 7B may have a shape that corresponds the first electrode of FIGS. 6A and 6B cut longitudinally in half. That is to say, at least one protruding thread 712 may be formed on an upper portion close to an injection hole 722 of a second electrode 702 of a platform 711 constituting the first electrode 701. The lower half of the platform 711 may be removed to increase a size of a reaction space. With such configuration of the first electrode 701, the overall size of the vapor deposition reactor may be minimized. Other constitutions and functions of the vapor deposition reactor are apparent from FIGS. 6A and 6B, and thus, a detailed description thereof is omitted for the purpose of brevity.

Figure 8:
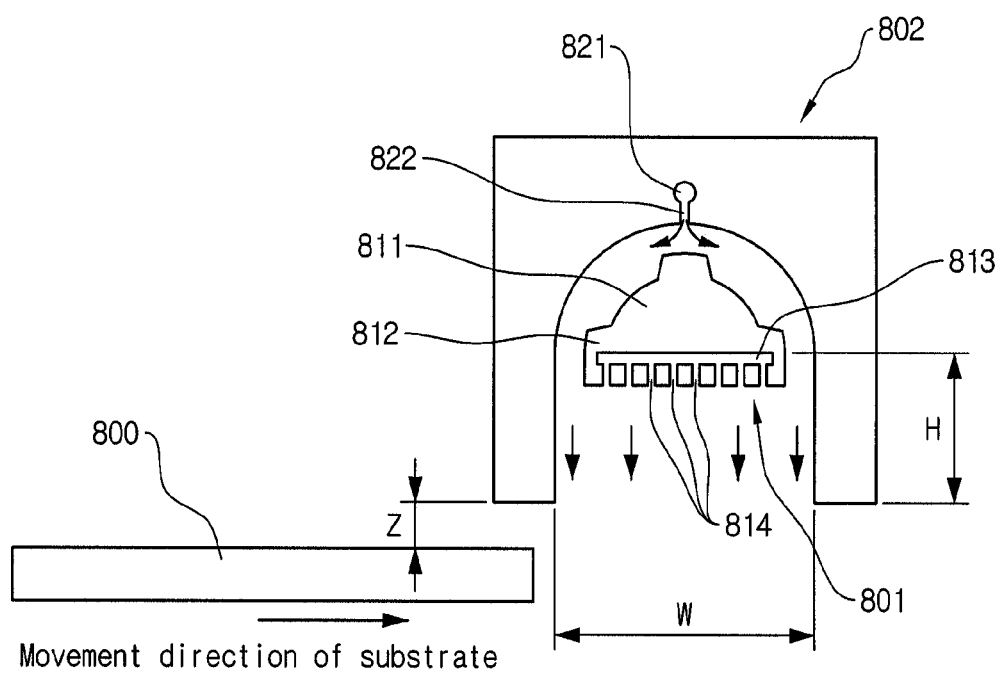
FIG. 8 is a cross-sectional view of a vapor deposition reactor according to another example embodiment.

FIG. 8 is a cross-sectional view of a vapor deposition reactor according to another example embodiment. A showerhead type injector of the vapor deposition reactor may be formed at the bottom surface of a platform 811 constituting a first electrode 801. That is, a channel 813 and at least one injection hole 814 connected to the channel 813 may be formed at a lower portion of the platform 811. The channel 813 and the injection hole 814 may be formed by processing the platform 811, or may be attached to the platform 811 after being processed through a separate process. Using the vapor deposition reactor, it is possible to inject a material through the injection hole 814 to a substrate 800 located below. That is, because the channel 813 and the injection hole 814 are formed on the first electrode 801 as well as on a second electrode 802, a material may be injected onto the substrate 800 below. For example, if the vapor deposition reactor is employed for ALD, a reactant precursor may be injected to the substrate 800 through an injection hole 822 of the second electrode 802. Further, once the reactant precursor is injected through the injection hole 822 while plasma is being generated, a purge gas may be injected from the injection of the reactant precursor later through the injection hole 822 with a time interval.

A source precursor may be injected onto the substrate 800 through the injection hole 814 of the first electrode 801. Accordingly, by applying the reactant precursor excited and/or decomposed by plasma onto the substrate 800 along with the source precursor, a thin film with an improved quality may be obtained. In addition, the channel 813 and the injection hole 814 formed on the first electrode 801 allow a relatively easy cleaning.

Other constitutions and functions of the vapor deposition reactor illustrated in FIG. 8 are apparent from the figure; and therefore, a detailed description is omitted herein for the purpose of brevity.

Figure 9A:
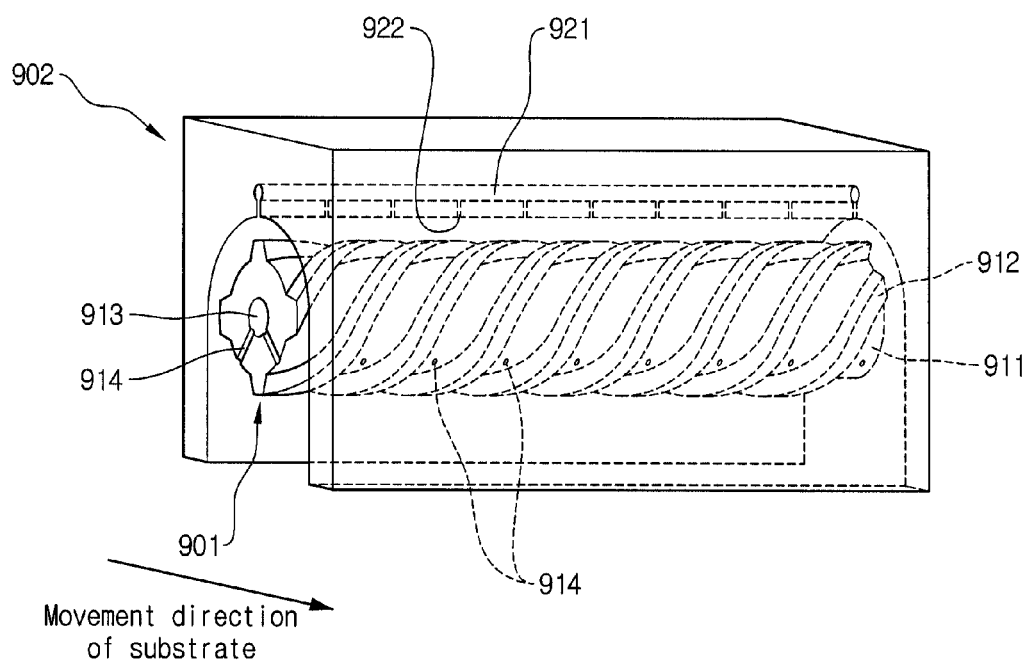
FIG. 9A is a perspective view of a vapor deposition reactor according to another example embodiment.
Figure 9B:
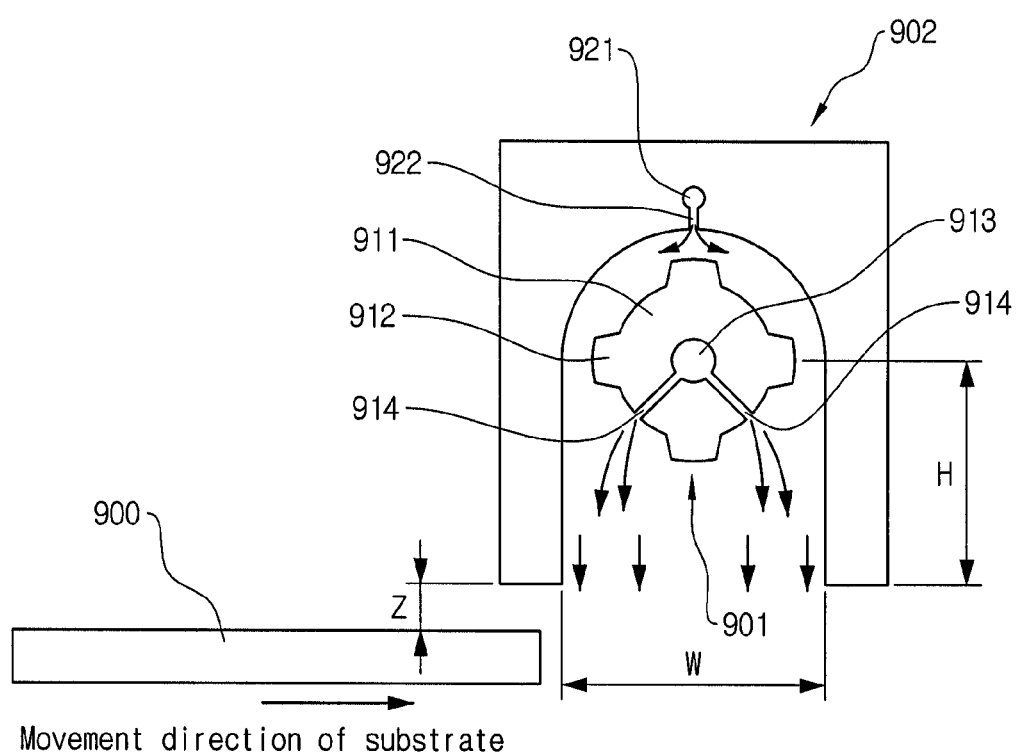
FIG. 9B is a cross-sectional view of the vapor deposition reactor of FIG. 9A.

FIG. 9A is a perspective view of a vapor deposition reactor according to another example embodiment. FIG. 9B is a cross-sectional view of the vapor deposition reactor of FIG. 9A. The first electrode 901 of FIGS. 9A and 9B may comprise may include a platform 911 having a channel 913 formed therein. At least one injection hole 914 connected to the channel 913 may be formed in the first electrode 901. The channel 913 may extend along a radial direction of the platform 911. A plurality of injection holes 914 may be separated with a predetermined interval along the length of the platform 911. Although two injection holes 914 are provided in each radial cross-section of the platform 911 in FIG. 9B, this is merely an example. In another example embodiment, the number of the injection holes 914 provided at each radial cross-section may be one or more than two.

In the vapor deposition reactor, the channel 913 and the injection hole 914 are formed in the first electrode 901 to inject a material in addition to channels in the second electrode 902. For example, a reactant precursor may be injected through an injection hole 922 of the second electrode 902, and a source precursor may be injected through the injection hole 914 of the first electrode 901. In this case, the injection hole 914 of the first electrode 901 may be formed at a lower portion of the platform 911 so that the source precursor injected through the injection hole 914 is not affected by plasma. In another example embodiment, the injection hole 914 is formed at an upper portion of the platform 911, and a reactant precursor is injected through the injection hole 914.

Other constitutions and functions of the vapor deposition reactor illustrated in FIGS. 9A and 9B are apparent from the figures, and therefore, a detailed description thereof is omitted for the purpose of brevity.

Figure 10:
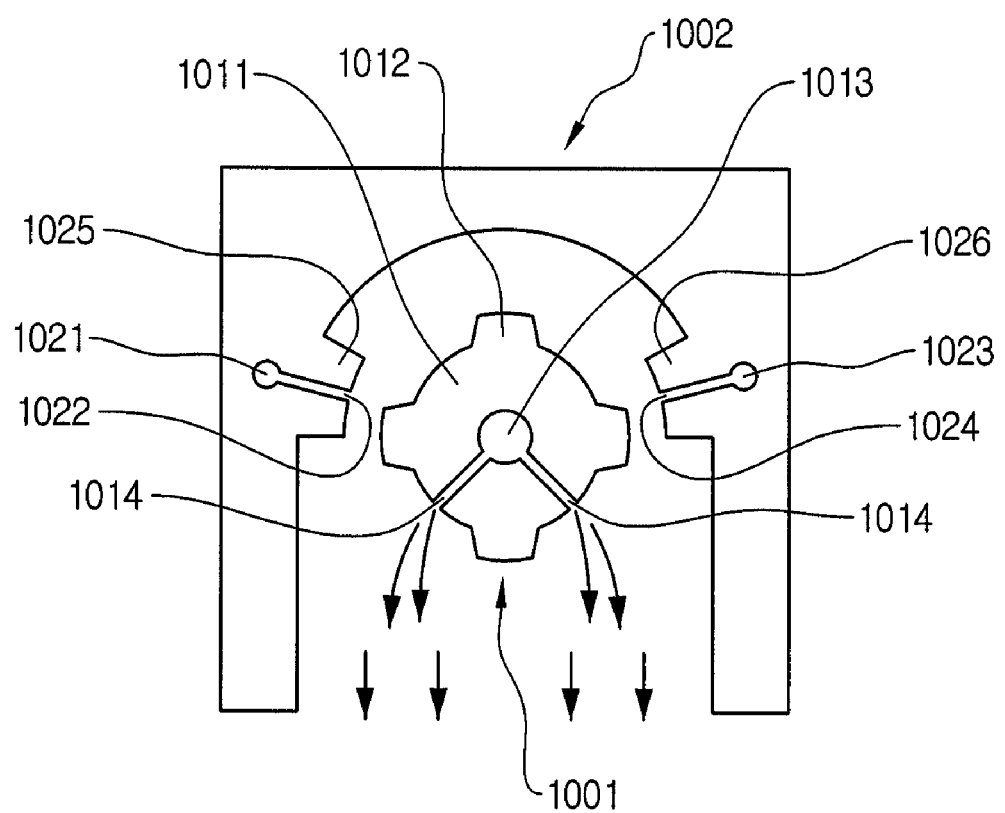
FIG. 10 is a cross-sectional view of a vapor deposition reactor according to another example embodiment.

FIG. 10 is a cross-sectional view of a vapor deposition reactor according to another example embodiment. A second electrode 1002 of a vapor deposition reactor may comprise protrusions 1025, 1026 projecting from its inner surface toward a first electrode 1001. Further, a first channel 1021, at least one first injection hole 1022 connected to the first channel 1021, a second channel 1023, and at least one second injection hole 1024 connected to the second channel 1023 may be formed in the second electrode 1002. The first injection hole 1021 may be located at a protrusion 1025, and the second injection hole 1024 may be located at another protrusion 1026.

The vapor deposition reactor is equipped with the second electrode 1002 having the protrusions 1025, 1026 to generate plasma at atmospheric pressure or at a relatively high pressure. That is, plasma may be generated at a region at which the protrusions 1025, 1026 of the second electrode 1002 and a protrusion 1012 of the first electrode 1001 are close to each other. The first injection hole 1022 at the protrusion 1025 and the second injection hole 1024 at the protrusion 1026 may be used to inject a reactant precursor. The injection hole 1014 of the first electrode 1001 may be used to inject a source precursor.

In another example embodiment where the first electrode 1001 does not comprise an injection hole, a source precursor may be injected through the first injection hole 1022 of the second electrode 1002, and a reactant precursor may be injected through the second injection hole 1024 of the second electrode 1002.

The quantity of the material injected through the injection hole 1014 of the first electrode 1001 and through the first injection hole 1022 and the second injection hole 1024 of the second electrode 1002 may be appropriately determined in consideration of a pressure at each region of a reaction space. For example, by maintaining a pressure of a region between an upper portion of the first electrode 1001 and the second electrode 1002 higher than a pressure of a region below the first electrode 1001, the source precursor injected through the injection hole 1014 may be prevented from being mingled into a plasma generation region.

In another example embodiment, the first and second injection holes 1022, 1024 of the second electrode 1002 may be formed at a region of the second electrode 1002 except for the protrusions 1025, 1026 instead of on the protrusions 1025, 1026. Moreover, in another example embodiment, the second electrode 1002 may further comprise an additional injection hole (for example, the injection hole 922 of FIG. 9B) between the protrusions 1025, 1026, in addition to the first injection hole 1022 and the second injection hole 1024.

Figure 11:
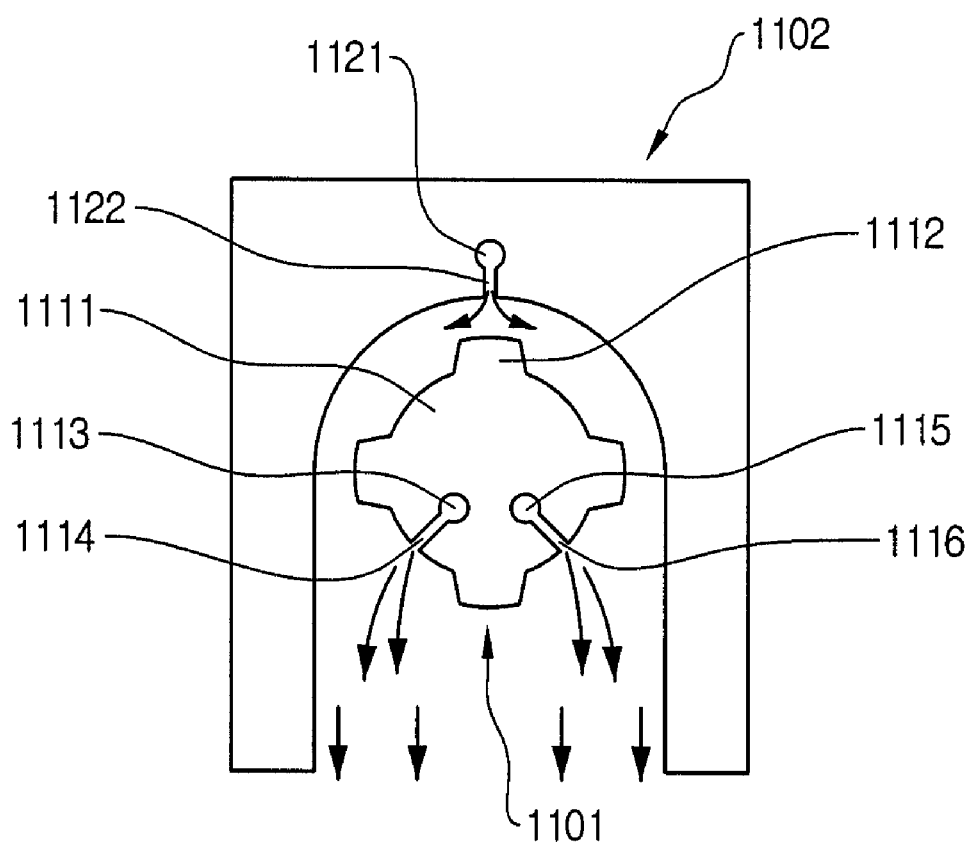
FIG. 11 is a cross-sectional view of a vapor deposition reactor according to another example embodiment.

FIG. 11 is a cross-sectional view of a vapor deposition reactor according to another example embodiment. A first channel 1113 and a second channel 1115 may be formed in a first electrode 1101 of a vapor deposition reactor. Further, at least one first injection hole 1114 connected to the first channel 1113, and at least one second injection hole 1116 connected to the second channel 1115 may be formed in the first electrode 1101. Identical or different materials may be injected through the first injection hole 1114 and the second injection hole 1116. Further, a channel 1121 and an injection hole 1122 connected to the channel 1121 may be formed in a second electrode 1102.

Hereinafter, an example method for forming a radical-treated thin film using the vapor deposition reactor will be described. For example, $SiH_4$ may be injected through the first injection hole 1114 of the first electrode 1101. Ar or $H_2$ gas may be injected through the injection hole 1122 of the second electrode 1102. Meanwhile, plasma may be generated between an upper portion of the first electrode 1101 and the second electrode 1102. When a substrate moving from the left is located below the first injection hole 1114, $SiH_4$ may be dissociated by Ar plasma or $H_2$ plasma and $Si_x$ or $SiH_x$ may be adsorbed on the substrate.

$N_2O$, $H_2O$ or $O_2$ may be injected through the second injection hole 1116 of the first electrode 1101. In this case, radicals excited by Ar plasma or $H_2$ plasma may excite $N_2O$, $H_2O$ or $O_2$ to generate O* radicals. When the substrate moves to the right and is located below the second injection hole 1116, the material on the substrate may be oxidized by or react with the O* radicals to form a $SiO_2$ thin film on the substrate.

In this case, mixing of unwanted particles may be prevented because the oxidation by O* radicals occurs as the substrate moves after the adsorption or decomposition of $SiH_x$ on the substrate surface. Further, a thin film with a superior conformity may be obtained because $SiH_x$, which has a faster atomic mobility than $SiO_2$, is adsorbed. Accordingly, the vapor deposition reactor may be utilized, for example, for gap-filling shallow trench isolation (STI) using $SiO_2$.

Although the method for forming thin film was described with reference to the vapor deposition reactor illustrated in FIG. 11 as an example, the film may be formed using other vapor deposition reactors according to other example embodiments. For example, a thin film similar to that described above may be formed by using injection holes of the second electrode 1102 (for example, the first injection hole 1022 and the second injection hole 1024 of FIG. 10), instead of the first injection hole 1114 and the second injection hole 1116 of the first electrode 1101.

Figure 12:
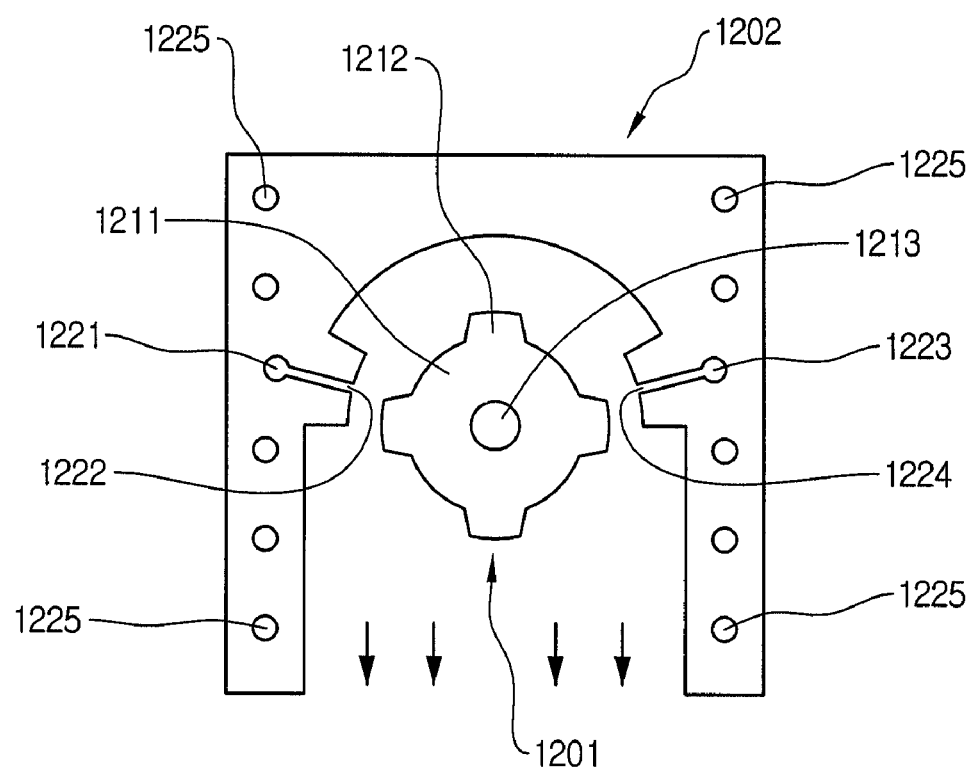
FIG. 12 is a cross-sectional view of a vapor deposition reactor according to another example embodiment.

FIG. 12 is a cross-sectional view of a vapor deposition reactor according to another example embodiment. A channel 1213 located at a center of a platform 1211 may be formed in the first electrode 1201 of a vapor deposition reactor. By conveying cooling water through the channel 1213, temperature rise of the first electrode 1201 due to plasma may be reduced or prevented. Further, a second electrode 1202 may comprise at least one channel 1225 for circulating cooling water. That is to say, the temperature of the first electrode 1201 and/or the second electrode 1202 may be controlled by means of the at least one channel for flowing cooling water equipped at the first electrode 1201 and/or the second electrode 1202.

Figure 13:
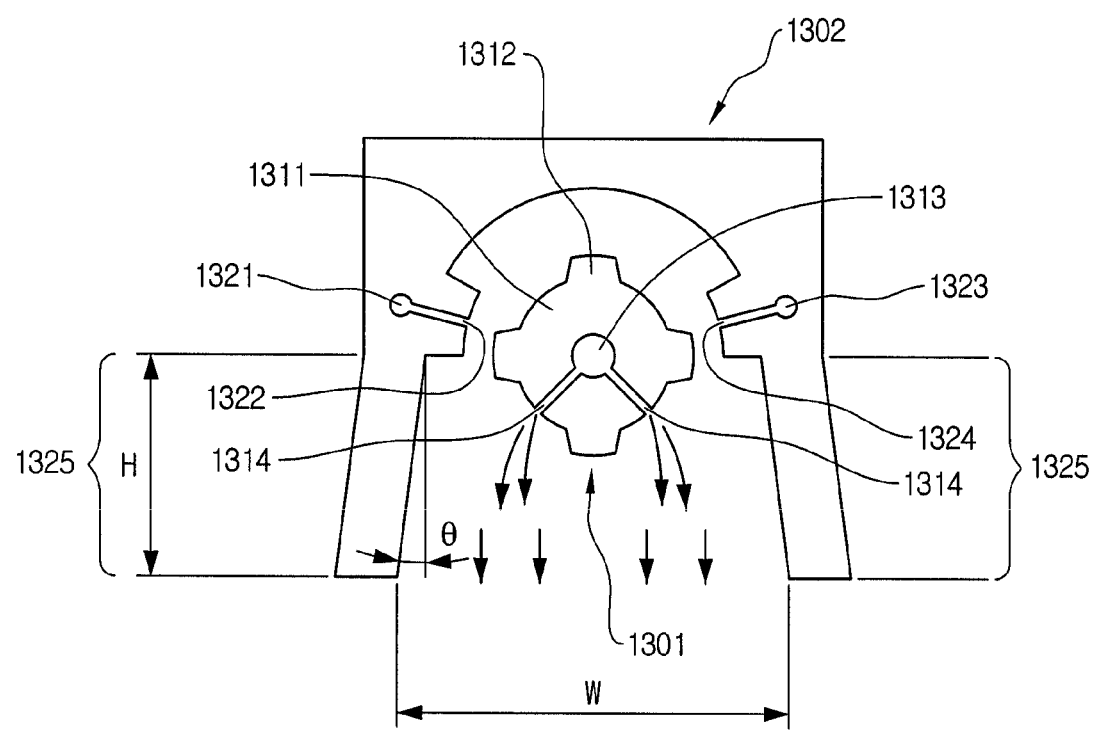
FIG. 13 is a cross-sectional view of a vapor deposition reactor according to another example embodiment.

FIG. 13 is a cross-sectional view of a vapor deposition reactor according to another example embodiment. A second electrode 1302 has an extending portion 1325 extending toward a substrate below. The extending portion 1325 has a length H, which corresponds to a height at which a first electrode 1301 is located and determines a size of a reaction space. The extending portion 1325 may be widened with respect to a vertical direction (i.e., a direction perpendicular to the surface of a substrate below) by increasing an angle θ to increase the width of a region at which plasma is applied to the substrate. The angle θ may have an arbitrary value larger than 0.

Other constitutions and functions of the vapor deposition reactor in FIG. 13 are apparent from FIG. 13, and therefore, a detailed description thereof is omitted herein for the purpose of brevity.

By using the vapor deposition reactor according to this disclosure, damage of a substrate due to direct exposure to plasma may be reduced or prevented. Further, it is possible to prevent excessive mixing of by-products produced by decomposition of a source precursor into a thin film during a thin film formation process by atomic layer deposition (ALD). Further, it is possible to separately inject a source precursor, reactant precursor, and a reactant gas for plasma generation to a vapor deposition reactor. Besides, since space for plasma generation and reaction space are separated from each other, the reaction space may be minimized and the efficiency of the source precursor (i.e., the transition of the injected source precursor into thin film) may be improved.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A vapor deposition reactor for depositing a thin film on a substrate, comprising:
   a first electrode comprising a body formed with a first channel and an opening, at least one first injection hole connected to the first channel and reaction space located away from the substrate; and
   a second electrode placed in the reaction space formed in the body of the first electrode, part of the second electrode facing away from the substrate and surrounded by the body of the first electrode to generate plasma or pulse discharge within the reaction space but part of the second electrode facing the substrate not surrounded by the body of the first electrode and communicating with the substrate via the opening, a width of the second electrode along a direction of relative movement between the vapor deposition reactor and the substrate is smaller than a width of the opening in the direction, a material injected into the reaction space between the first electrode and the second electrode via the first channel and the at least one first injection hole, the second electrode comprising:
   a platform extending longitudinally in a direction parallel to a top surface of the substrate, and
   at least one protrusion formed on the platform for generating the plasma or pulse discharge responsive to applying a voltage difference across the first electrode and the second electrode.

2. The vapor deposition reactor of claim 1, wherein a second channel and at least one second injection hole connected to the second channel are formed in the second electrode to inject another material onto the top surface of the substrate.

3. The vapor deposition reactor of claim 1, wherein the at least one protrusion comprises a protruding thread formed on an outer surface of the platform extending spirally along a length of the platform.

4. The vapor deposition reactor of claim 1, wherein the cross-section of the platform is concentrically.

5. The vapor deposition reactor of claim 1, wherein at least one of the first electrode or the second electrode is formed with at least one channel for conveying cooling water.

6. The vapor deposition reactor of claim 1, wherein the first channel extends in the longitudinal direction of the platform.

7. The vapor deposition reactor of claim 1, wherein the platform is a cylinder.

8. The vapor deposition reactor of claim 1, wherein the substrate is moved relative to the body of the first electrode while the material is injected into the reaction space between the first electrode and the second electrode.

9. The vapor deposition reactor of claim 1, wherein the materials is a source precursor or a reactant precursor for performing atomic layer deposition (ALD) on the top surface of the substrate.

10. The vapor deposition reactor of claim 1, wherein the cross-section of the platform is a circle or a semi-circle.

11. The vapor deposition reactor of claim 1, wherein the reaction space is open towards the top of the substrate, and wherein the second electrode is placed within the reaction space.

12. The vapor deposition reactor of claim 1, further comprising a power source for applying voltage between the first electrode and the second electrode.

13. The vapor deposition reactor of claim 1, wherein a height of the second electrode is 10 mm to 100 mm.

14. The vapor deposition reactor of claim 13, wherein a distance from the bottom of the body of the first electrode to the top surface of the substrate is 0.1 mm to 5 mm.

* * * * *